US006489066B2

(12) United States Patent
Mirkanimi (10) Patent No.: US 6,489,066 B2
(45) Date of Patent: Dec. 3, 2002

(54) MITIGATION OF SUBSTRATE DEFECTS IN REFLECTIVE RETICLES USING SEQUENTIAL COATING AND ANNEALING (75) Inventor: Paul B. Mirkanimi, Sunol, CA (US)

(73) Assignee: The Regents of the University of California, Oakland, CA (US)

( * ) Notice: Subject to any disclaimer, the term of this patent is extended or adjusted under 35 U.S.C. 154(b) by 73 days.

(21) Appl. No.: 09/819,156

(22) Filed: Mar. 27, 2001

(65) Prior Publication Data

US 2001/0019803 A1 Sep. 6, 2001

Related U.S. Application Data (63) Continuation-in-part of application No. 09/454,715, filed on Dec. 6, 1999, now Pat. No. 6,319,635.

(51) Int. Cl.[7] ................................................. G03F 9/00
(52) U.S. Cl. ............................................ 430/5; 378/35
(58) Field of Search ............................. 430/5, 322, 330, 430/394; 378/34, 35

(56) References Cited

U.S. PATENT DOCUMENTS

| 4,634,270 A | * | 1/1987 | Yokoo et al. | ............... 430/5 |
| 5,008,156 A | * | 4/1991 | Hong | ............... 428/506 |
| 5,460,908 A | * | 10/1995 | Reinberg et al. | ............... 430/5 |
| 5,780,161 A | * | 7/1998 | Hsu | ............... 428/426 |
| 5,922,497 A | * | 7/1999 | Pierrat | ............... 430/5 |
| 5,928,817 A | * | 7/1999 | Yan et al. | ............... 430/5 |
| 5,935,737 A | * | 8/1999 | Yan | ............... 430/5 |
| 5,953,492 A | * | 9/1999 | Yabe et al. | ............... 378/35 |

* cited by examiner

Primary Examiner—S. Rosasco
(74) Attorney, Agent, or Firm—L. E. Carnahan; Alan H. Thompson (57) ABSTRACT A buffer-layer to minimize the size of defects on a reticle substrate prior to deposition of a reflective coating on the substrate. The buffer-layer is formed by either a multilayer deposited on the substrate or by a plurality of sequentially deposited and annealed coatings deposited on the substrate. The plurality of sequentially deposited and annealed coating may comprise multilayer and single layer coatings. The multilayer deposited and annealed buffer layer coatings may be of the same or different material than the reflecting coating thereafter deposited on the buffer-layer.

22 Claims, 4 Drawing Sheets

MITIGATION OF SUBSTRATE DEFECTS IN REFLECTIVE RETICLES USING SEQUENTIAL COATING AND ANNEALING

RELATED APPLICATION

This application is a continuation-in-part of U.S. application Ser. No. 09/454,715, filed Dec. 6, 1999.

The United States Government has rights in this invention pursuant to Contract No. W-7405-ENG-48 between the United States Department of Energy and the University of California for the operation of Lawrence Livermore National Laboratory.

BACKGROUND OF THE INVENTION

1. Field of the Invention

The present invention relates to minimizing defects in components produced by lithography, particularly to the mitigation of substrate defects in reticles or masks utilized in extreme ultraviolet lithography, and more particularly to the use of a buffer layer deposited intermediate a reticle substrate and a reflective coating for mitigating substrate defects in reticles, the buffer layer being formed by a sequential coating and annealing process.

2. Description of Related Art

Extreme ultraviolet lithography (EUVL) systems are being developed for the production of electronic components formed on wafers via reflected radiation. The EUVL systems include reticles or masks that must be essentially free of defects that will print at the wafer which will yield defective components. The reticles, for example, may be fabricated by depositing highly reflective multilayer coatings, such as Mo/Si, on super polished substrates. Any localized structural imperfections on the reticle substrate may nucleate and evolve during the multilayer coating process into a defect that perturbs the reflected radiation field sufficiently to print at the water. Thus, there has been a need for mitigating the effect of small particle contaminants on the surface of the substrate that would nucleate a defect in the reflective coating.

The reticle defect problem may be divided into two components. First, there are the defects associated with the condition of the reticle substrate. These are particles, pits, or scratches on the reticle substrate that nucleate a growth defect in the multilayer coating. Second, there are the defects that are introduced during or after the multilayer coating process, which are particle contaminants that are embedded within or are sitting on the top surface of the coating. A low defect multilayer coating technology based on ion beam sputtering has been developed so that the coatings now being deposited are essentially defect-free, thus the greater risk is the starting conditions of the reticle substrate.

Modeling has been carried out that simulates the growth defects nucleated by spherical particles. The results have indicated that particles as small as about 25 nm in diameter will nucleate defects in multilayer coatings, which can image at the wafer. Hence, all particles of a size greater than about 25 nm must be removed from the reticle substrates prior to the deposition of the reflective coating. Currently, removal of particles from the reticle substrates is carried out by cleaning processes that are expected to be ineffective for the removal of particles of less than about 60 nm, particularly since verification that such small particles exist is difficult.

Prior efforts to resolve the reticle substrate defect problem involved a single layer buffer-layer, see K. B. Nguyen, et al., *J. Vac. Sci. Technol.* 11:2964 (1993), where a 200 nm thick single-layer amorphous silicon (a-Si) buffer-layer was deposited on the substrate prior to a Mo/Si multilayer deposition in an attempt to smooth out lithographically defined steps (defects) on a silicon surface. This resulted in some reduction in the defect height and the transition at the edges of the step was made less severe by the buffer-layer, which is advantageous. However, the surface roughness of the Si was increased significantly (from 0.2 nm to 0.7 nm), making this process impractical for EUV lithography.

Currently, there is a process having the capability of depositing a-Si approaching 200 nm in thickness with much lower roughness than that observed by Nguyen, referenced above. However, the large stress typically found in smooth, single-layer films like a-Si can limit the applicability of this single-layer approach for the buffer layer.

As an alternative to cleaning and single-layer buffer layers, the invention described and claimed in above referenced application Ser. No. 09/454,715, mitigates the effects of these small particles by depositing a multilayer film as a buffer layer in between the substrate and the reflective coating and the multilayer film can be deposited alone or with annealing during and or after deposition. The purpose of this buffer layer is to reduce the perturbation of the reflective coating due to particles, pits, or scratches on the substrate.

The present invention is an improvement over the technique of application Ser. No. 09/454,715 and involves mitigating the effect of the substrate particles on reticles by sequential coating and annealing. The sequential buffer layer coatings may be single layer or multilayer coatings and of the same or different materials, with either slow or fast post deposition annealing after each coating step.

The buffer layer coatings may be of the same material as the reflective deposited coating. The first buffer-layer may be tailored to flatten-out higher aspect ratio bumps and asperities. The second and subsequent buffer-layer coatings would be tailored to flatten out lower aspect ratio bumps and asperities. A reflective multilayer coating is later deposited on this healed surface to form a reticle blank for extreme ultraviolet (EVU) lithography.

SUMMARY OF INVENTION

It is an object of the present invention to mitigate the effects of substrate defects in coated reticles used for extreme ultraviolet lithography. A further object of the invention is to provide a reticle substrate with sequentially deposited and annealed buffer layers to mitigate substrate defects. A further object of the invention is to provide sequentially deposited buffer layer between a reticle substrate and a multilayer reflective coating with post annealing of each deposited buffer layer to mitigate the adverse effects of substrate defects. Another object of the invention is to provide a plurality of buffer layers between the substrate and a multilayer coating of a reticle utilized in extreme ultraviolet lithography, each buffer layer being annealed following deposition.

Yet another object of the invention involves the mitigation of substrate defects in reticles for extreme ultraviolet lithography using single layer or multilayer annealed buffer layers that are atomically smooth, have good smoothing properties, have low residual stress, and the multilayer buffer layers exhibit contraction during growth due to intermixing of the interfaces.

Other objects and advantages of the present invention will become apparent from the following description and accompanying drawings. The present invention is directed to mitigate the effects of particles or other defects on a reticle substrate, particularly having a size <60 nm, by depositing annealed single or multilayer films as buffer layers between the substrate and the reflective coatings. The purpose of this buffer layer is to reduce the perturbation of the reflective coatings due to the particles, pits, or scratches on the substrate. Specifically, the sequentially deposited and annealed buffer layers are designed to smooth out the substrate topography to a point where the remaining perturbations are too small to nucleate growth defects in the reflective coating that will print in an EUV lithography tool. The buffer layers are not used as a reflective coating, and thus their reflectivity to EUVL radiation need not be optimized.

The sequential buffer layers exhibit several basic characteristics. The buffer layers provide smoothing behavior, that is, relaxation of the surface height variations due to the particles, pits and scratches on the substrate. The multilayer buffer layers also exhibit volume contraction during growth due to intermixing at the interfaces of the alternating layers. The buffer layers do not substantially increase the high spatial frequency roughness of the substrate surface (e.g., roughness is typically less than about 0.3 nm rms). The buffer layers have sufficiently low residual stress (less than about 500 MPa) so that a total buffer layer thickness of up to about 100 $\mu$m can be deposited without compromising the performance and stability of the reflective coating. Finally, the deposition process of each sequential buffer layer should be clean; there should must be substantially no defects added in the process of growing the buffer multilayer.

The buffer layers may be made from materials different from the reflective coating, or from the same materials. Although the buffer layers may be made from the same materials as the reflective multilayer, the buffer layers serve a different function and need not be optimized for high reflectance. For example the multilayer buffer layers may differ structurally from the reflective coating because of the intermixing at the layer interfaces.

Multilayer materials that are atomically smooth and have good smoothing properties may be used as the buffer layer. Multilayer systems that satisfy the above-listed multilayer buffer layer requirements include ion beam sputtered (IBS) molybdenum-silicon (Mo/Si), and MoRu/Be multilayer films. Other potential buffer layer multilayer materials that demonstrate the above-listed characteristics include Me/Si, Me/Be, Me/B, and Me/$B_4C$, and where Me is a metal or alloy such as Mo, W, Ni, Cr, Ru, Rh, MoRu, or MoRh.

In the present invention, the buffer layers are deposited using an ultraclean ion beam sputtering process so that no defects are added in the deposition step. Each deposited buffer layer is annealed by a rapid or slow annealing technique. The buffer layers are deposited with minimal surface roughness and residual stress so that they do not compromise the performance of the reflective multilayer coating deposited on top of the buffer layers. The same ion beam tool can also be used to deposit the overlying reflective coating.

The present invention is a sequential coating and annealing technique to mitigate the effects of small particle contaminants in reticles for EUV lithography. The first step is to deposit a low particulate, very smooth buffer-layer coating which could have a significant amount of film stress; ion beam sputtered Mo/Si multilayer coatings and amorphous Si coatings are two examples. The first buffer-layer coating will likely be tailored to flatten out high aspect ratio bumps and asperities. Due to the significant film stress and the relatively thick substrates needed for the reticles, only a modest coating thickness can be applied at first. The sample is then annealed, either slowly or rapidly, with a temperature compatible with the substrates. Another buffer-layer coating layer is then applied and subsequently annealed, and the procedure is repeated as many times as is necessary to smooth the topology of the coating surface while retaining a surface with a sufficiently low roughness. The second and subsequent buffer-layer coatings could be tailored to flatten out low aspect ratio bumps and asperities. A reflective multilayer coating is later deposited on this healed surface to form a reticle blank for EUV lithography. In addition to Mo/Si, the multilayer coating may be composed of MoRu/Be or Mo/Be; and in addition to a-Si the single layer coatings may be composed of amorphous carbon. The annealing temperature and time would vary depending on the composition of the coating.

There is a strong commercial driving force for increased miniaturization in electronic devices, and EUVL systems have significant potential provided that a critical element thereof, the reflective multilayer reticle, is nearly defect-free.

Thus, the present invention has the potential to make such a system commercially viable.

BRIEF DESCRIPTION OF THE DRAWINGS

The accompanying drawings, which are incorporated into and form a part of the disclosure, illustrate the invention and, together with the description, serve to explain the principles of the invention.

DETAILED DESCRIPTION OF THE INVENTION

The present invention is directed to the mitigation of substrate defects on reticles or masks for extreme ultraviolet lithography (EUVL) using sequentially deposited and annealed buffer layers. The sequential (two or more) deposited/annealed buffer layers may be composite of single layer and/or multilayers, and may be of the same or different material than the reflective multilayer coating later deposited on this healed surface to form a reticle blank for EUVL, for example.

Figure 1:
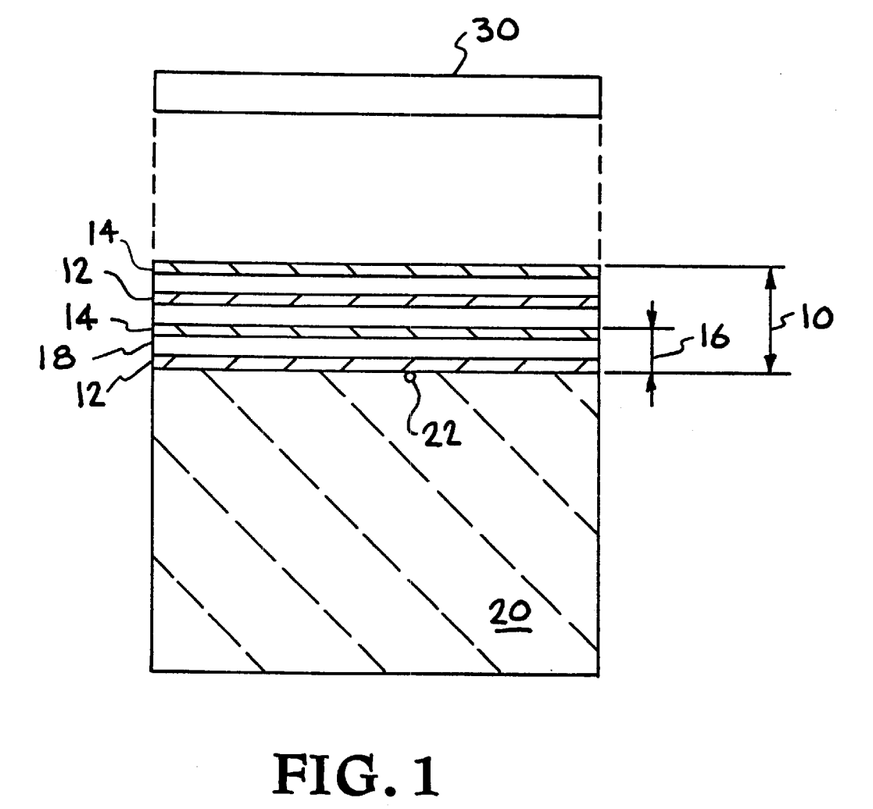
FIG. 1 shows a multilayer buffer on a reticle according to the invention of the above referenced application Ser. No. 09/454,715.

The present invention differs from the mitigation technique described and claimed in the above referenced copending application Ser. No. 09/454,715, in which, as shown in FIG. 1, multilayer buffer-layer coatings were used to minimize the size of defects on a reticle substrate prior to deposition of a reflective multilayer coating, and annealing was described as a possible processing step for the buffer-layer. Also, in that copending application it was mentioned that the film growth parameters would be varied to optimize the smoothing properties of the buffer-layer coating. However, there was no teaching in that prior copending application of sequentially deposited buffer layers with post deposition annealing of each layer, nor that several multilayer buffer-layers could be utilized, with the growth parameters of each buffer-layer designed differently, as hereinafter described.

With the sequential annealing of the present invention it is possible to use thick homogeneous buffer-layer films with smooth surfaces and large coating stresses, such as amorphous silicon (a-Si), since sequential annealing can be used to lower the stress to provide for a thick buffer-layer coating. Such could not be carried out using the buffer-layer approach and thus the present invention constitutes an improvement thereover. In view of the relationship to the mitigation technique of the referenced co-pending application, an embodiment of that technique is illustrated in FIG. 1.

As shown in FIG. 1, a multilayer film is deposited as a buffer layer 10 on a reticle substrate 20 to cover defects 22, such as small particle containments, pits or scratches in the surface. The buffer layer 10 comprises a multilayer of at least a pair 16 (bilayer) of alternating layers 12, 14. Typically many pairs 16, as shown, comprise the multilayer buffer layer 10. The multilayer could comprise a plurality of trilayers or quadlayers, although bilayers are most typical. The buffer layer 10 is deposited on the reticle substrate 20 prior to deposition of a reflective coating 30. The reflective coating may be a single layer, or a multilayer. Reflective coatings for EUV lithography are well known in the art.

The multilayer buffer layer is atomically smooth and has good smoothing properties and low residual stress. The buffer layer 10 also exhibits volume contraction during growth due to intermixing at the interfaces of the layers 12, 14. This intermixing creates an interlayer 18 between the layers 12, 14, formed of a mixture of the two materials. The layers 12, 14 are comprised of two or more elements or alloys, such as Mo/Si, Mo/Be or MoRu/Be. Multilayer films that should demonstrate the above-referenced characteristics include Me/Si, Me/Be, Me/B, Me/B$_4$C and Me/C, where Me is a metal or alloy such as Mo, W, Ni, Cr, Ru, Rh, MoRu, or MoRh.

The multilayer buffer layer of FIG. 1 is deposited using an ultraclean ion beam sputtering process so that no defects are added in the fabrication operation. The multilayer buffer layer is deposited with minimal surface roughness (preferably <3 Å RMS) so that it does not compromise the performance of the reflective coating deposited on top of the buffer layer.

Significant smoothing of small particles coated with Mo/Si multilayer films has been observed when deposited at near-normal incidence via a low particulate ion beam sputtering process. The nature of the smoothing process consists of both a reduction of the maximum height of the defect and a reduction of the volume of the defect. The reduction in defect height is controlled by surface relaxation during the film growth process, and the reduction in defect volume is controlled by the degree of intermixing of the materials (e.g., Mo and Si) at the multilayer interfaces. In addition, computer simulations of Mo/Si multilayer film growth show that intermixing and surface relaxation can be optimized to mitigate defects at least as large as 60 nm.

A modified version of a linear continuum growth model applied to multilayer film growth was used in computer simulations. See D. G. Stearns, *Appl. Phys. Lett.* 62:1745 (1993), which is incorporated herein by reference, in which the model used parameters such as ν, which characterizes the relaxation process, and n, which is a growth exponent and depends on the kinetic mechanism dominating the smoothing process. In the modified version of the Stearns growth model, a new parameter δΛ was introduced, which is the contraction in the bilayer period thickness due to the intermixing of the bilayer materials (e.g., Mo, Si) at the multilayer interfaces. This modified model accounts for the ability of multilayer films deposited on small particles or defects to reduce the defect volume.

Figure 2:
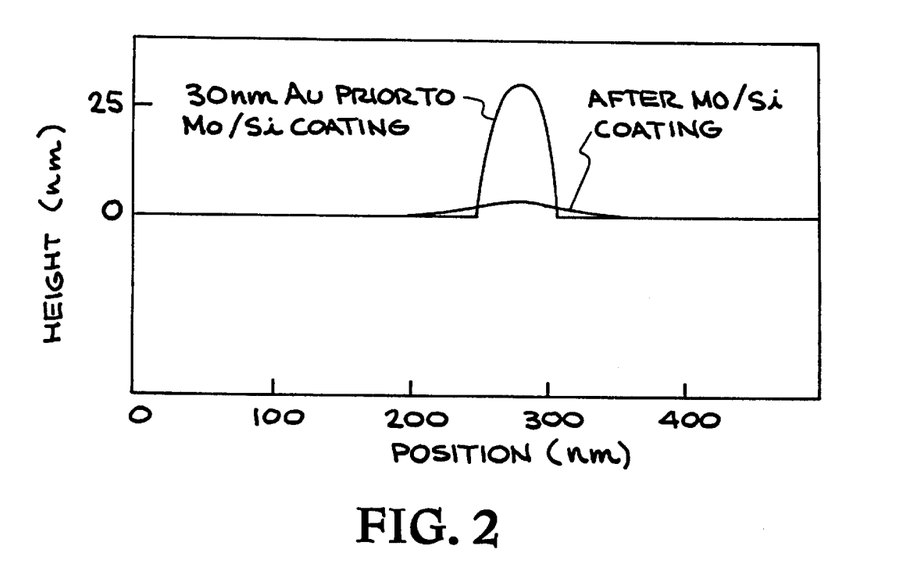
FIG. 2 graphically illustrates measurements of the surface of 30 nm diameter gold sphere before and after being coated at near-normal and off-normal incidence with a Mo/Si multilayer coating similar to FIG. 1.
Figure 3:
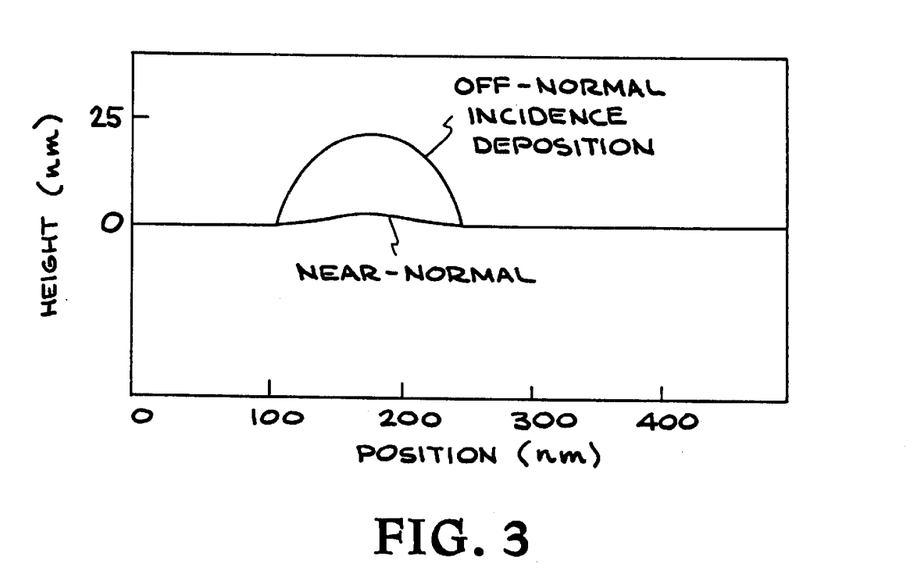
FIG. 3 graphically illustrates measurements of the gold sphere of FIG. 1 of the surface for Mo/Si deposited with the flux near normal and off normal.

The significant smoothing of small particles coated with Mo/Si multilayer films is illustrated in FIG. 2. For example, particles with diameters of 30–60 nm that are coated with Mo/Si films produce bumps at the surface of only 3–12 nm in height, and the defect volume is also reduced. These results are for ion beam sputtering in which the deposition flux is arriving at the substrate close to normal incidence (near-normal). For off-normal incidence, ion beam sputtering, or magnetron sputtering (which can have significant off-normal flux components), the resulting bumps at the surface can actually increase in size; this is illustrated in FIG. 3. Thus, near-normal incidence ion beam sputtered Mo/Si multilayer films are viable candidates for use as smoothing buffer layers.

Figure 4:
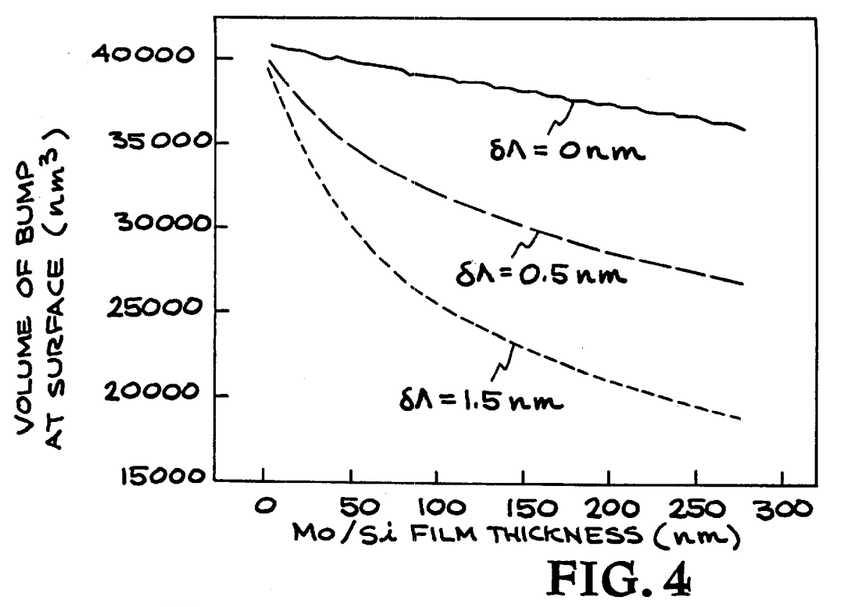
FIG. 4 graphically illustrates computer simulations of Mo/Si deposited on a 40 nm sphere showing the volumes of the bump at surface as a function of the film thickness.

According to the models the reduction in defect height is controlled by surface relaxation during the film growth process, and the reduction in defect volume is controlled by the intermixing at the multilayer interfaces, when there is concomitant bilayer contraction, δΛ. FIG. 4 shows that with increasing Mo/Si film thickness, the defect volume (as measured by the volume of the bump at the surface) is reduced, and that this reduction is much greater with increased intermixing. (Note that a single-layer buffer layer film could not have the effect of reducing the volume of the defect due to intermixing.) Methods to increase the amount of intermixing and thereby decrease the defect volume include: (1) using a secondary ion source directed at the film, (2) changing the bilayer period thickness and/or the ratio of elements in the multilayers (e.g., Mo:Si in Mo/Si multilayers), (3) annealing during and/or after multilayer deposition, (4) changing the deposition system operating pressure, or (5) varying other conditions to alter the energetics of the deposition process.

Figure 5:
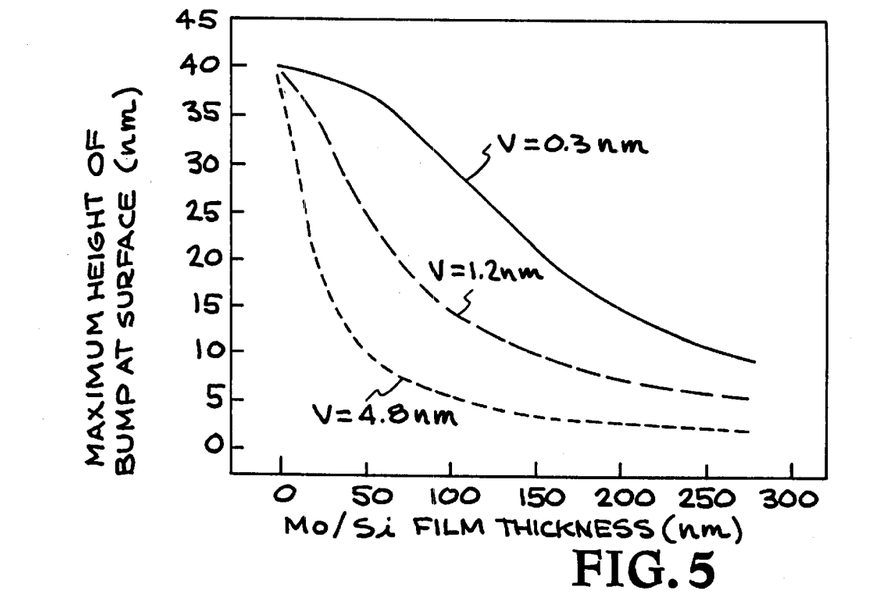
FIG. 5 graphically illustrates computer simulations showing the maximum height of the bump at the surface as a function of the film thickness.
Figure 6:
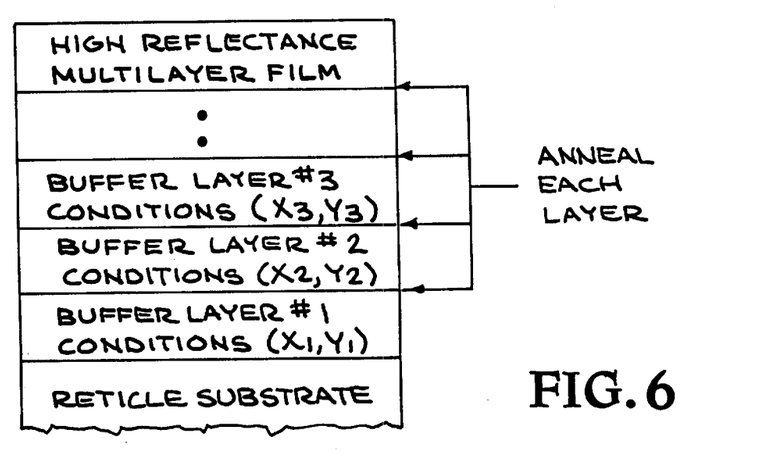
FIG. 6 schematically illustrates sequentially coated and annealed buffer layers intermediate a reticle substrate and a high reflective multilayer film in accordance with the present invention.
Figure 7:
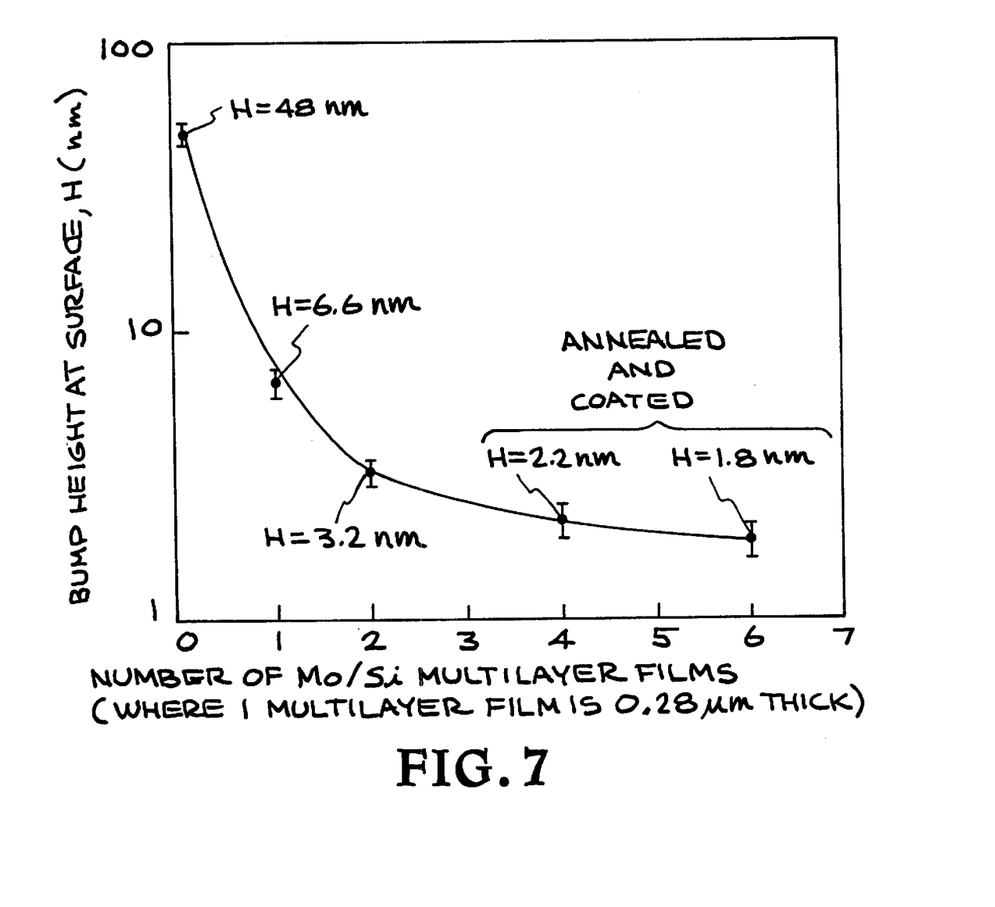
FIG. 7 graphically illustrates tests results verifying the invention.

Surface relaxation can also be increased in the buffer layer deposition process to reduce the defect height. FIG. 5 shows that with increasing Mo/Si film thickness, the defect height (i.e., the maximum height of the bump at the surface) is reduced, and that this reduction is much greater as the surface relaxation (ν) is increased. Increased ν could be achieved by all of the methods mentioned above for increasing intermixing except for (2).

As pointed out above, there are likely two mechanisms that suppress the perturbation: the relaxation of the surface that removes high frequency components in the surface topography, and the intermixing at the layer interfaces, with a concomitant contraction of the bilayer thickness, which reduces the volume of the defect. By mapping out the effect of the multilayer film growth parameters on the structure of the resulting growth defects, one can design a buffer layer that sufficiently smoothes out the particles on the substrate so that the remaining perturbations (hillhocks) at the surface of the buffer layer are too small to nucleate printable growth defects in the reflective multilayer coating.

A large number of multilayer growth simulations were performed to study the structure of growth defects nucleated by spherical particles having diameters of 20, 40, and 60 nm. The relaxation parameter $\nu$ and the bilayer contraction $\delta\Lambda$ were varied, since these should be adjustable in practice by changing the energetics of the deposition process. The growth exponent was fixed at n=2, consistent with the value obtained experimentally for IBS deposition of Mo/Si multilayers. The nominal structure of the buffer multilayer was chosen to be [Mo(2.6 nm)/Si(4.4 nm)]×40 layers, which has $\Gamma$=0.375 to allow a maximum bilayer contraction when the layers are completely intermixed.

The effectiveness of the buffer layer in smoothing over a 40 nm diameter particle was plotted with the maximum height and volume of the perturbation at the surface of the buffer layer for a relaxation parameter of $\nu$=1.2 nm and different values of the bilayer contraction $\delta\Lambda$. Both the height and volume of the defect are reduced by increasing $\delta\Lambda$ to an optimum value of 1.5 nm; the maximum height decreased from an initial value of 40 nm to 5.3 nm and the volume decreased from an initial value of 42000 $nm^3$ to 23000 $nm^3$. As the bilayer contraction is increased towards the maximum value of 2.31 nm (corresponding to complete intermixing of the multilayer), the beneficial effects of intermixing disappear and the height and volume return to the values found for no intermixing ($\delta\Lambda$=0 nm). This is due to the saturation of the contraction mechanism; when the bilayer is completely intermixed, the reduction in the surface height is the same everywhere, independent of the topography.

Next, the relaxation parameter $\nu$ was varied while keeping the bilayer contraction fixed at the optimum value of $\delta\Lambda$=1.5 nm. The variation in the maximum height and volume of the buffer layer was plotted for a 40 nm diameter particle. The relaxation parameter has opposite effects on the height and volume of the resulting perturbation. Increasing $\nu$ reduces the maximum height of the surface, whereas decreasing $\nu$ reduces the volume. This behavior is due to the effects of intermixing. When $\nu$ is small, the perturbation remains localized and the surface slope is larger, thereby allowing the intermixing to be more effective in reducing the volume of the perturbation. When $\nu$ is large, there is more smoothing of the perturbation, which reduces the height of the defect, but also decreases the surface slope and hence suppresses the volume reduction due to intermixing. The important point is that by varying $\nu$, the structure of the perturbation is changed in very different ways.

From the standpoint of printability, the most important information is the structure of the growth defect at the top of the reflective coating. To address this issue, simulations were performed in which a reflective multilayer coating was grown on top of the buffer layer. The structure of the reflecting multilayer was [Mo(2.8 nm)/Si(4.2 nm)]×40, corresponding to a standard high performance optical coating. For the reflective coating, the growth parameters found experimentally of $\nu$=1.2 nm, n=2 and $\delta\Lambda$=0.82 nm were used. The results for an initial particle size of 40 nm diameter were plotted. The defect structure is defined by the maximum height and volume of the surface perturbation at the top surface of the reflective coating. The shape of the perturbation was always found to be a Guassian of revolution. It is apparent that the application of a Mo/Si buffer multilayer can significantly modify the structure of the resulting growth defects. The best simultaneous reduction in the height and volume of the defect was obtained using a contraction of $\delta\Lambda$=1.5 nm and the smallest possible value of $\nu$ (0.3). However, smaller maximum height can be achieved at the expense of larger volume by applying very large values of $\nu$. Ultimately, the choice is determined by the printability of these various defect structures.

The effect of buffer layers or growth defects nucleated by 20 and 60 nm diameter spherical particles were also determined. The greatest challenge is to suppress the formation of defects from the largest particles, that is, in the 60 nm diameter range. The results indicate that the Mo/Si buffer layer will be able to reduce the maximum height of 30 nm defect to within the range of about 3 nm, a 50 nm defect reduced to ~8 nm, a 60 nm defect reduced to ~12 nm; thus the height of the defects are reduced by at least a factor of five. Larger reductions are possible with thicker buffer layers; however, the thickness is primarily limited by the residual stress of the film.

Two important issues impacting the viability of buffer layers are the accumulated roughness and the residual stress of the buffer layer. The rms roughness was calculated for different values of $\nu$ using the experimentally determined growth unit volume of $\Omega$=0.055 $nm^3$ and growth exponent of n=2. The reticle substrate was assumed to be perfectly smooth. In these calculations, the rms roughness was found by integrating the power spectral density over the frequency range of $10^{-6}$–1 $nm^{-1}$. The results are a function of the buffer layer thickness. It is evident that the roughness increases with decreasing values of $\nu$. However, even for the smallest value of $\nu$=0.3 nm, the rms roughness at the top surface of the buffer layer is only 0.26 nm. This amount of roughness will decrease the reflectivity of the reticle by approximately 3%. In some cases, a larger decrease in reflectivity may be acceptable, and thus a greater amount of roughness could also be tolerated.

The amount of acceptable residual stress in the buffer layer is determined by how much stress the reticle substrate can tolerate and what amount of stress causes delamination of the buffer layer and overlying reflective layer. For example, it is well documented that the residual stress can be large in Mo/Si multilayer coatings; the typical stress from a magnetron sputtered Mo/Si reflective coating having 40 bilayers is ~400 MPa. The stress in ion-beam sputtered Mo/Si was measured to be approximately the same. The stress in the buffer layer and for the total thickness (buffer layer+reflective layer) must be below the threshold that causes the layers to flake off or delaminate.

A simple implementation of a buffer layer is the use of a 40-bilayer Mo/Si multilayer coating. This buffer layer reduces the maximum height of the growth defect by over a factor of two for all particle sizes and also yields at least a ~25% reduction in the volume for all particle sizes. A significant decrease in the defect size can be obtained by adjusting the growth parameters of the buffer layer. In particular, it is important to be able to independently control the bilayer contraction so that $\delta\Lambda$=1.5 nm and $\nu$ can be adjusted to minimize either the height or the volume of the defect. Note that the structure of the buffer layer is not optimized for high EUV reflectance; the reflective coating is so optimized.

To independently adjust the growth parameters $\delta\Lambda$ and $\nu$, the power deposited at the film growth surface must be precisely controlled. Specifically, it is desirable to decouple the transport of the effluent (e.g., Mo and Si atoms) and the transport of energy to the growth surface. This can be achieved by using two ion beam sources: one to sputter the target material (e.g., Mo and Si atoms) onto the substrate, and a second ion source (e.g., argon) directly incident on the substrate to heat the growth surface. The film deposition should be performed at relatively high pressure (~1 mT) in order to minimize the energy of the incoming atoms and Ar neutrals reflected from the target. Then the energy flux at the growth surface will be determined primarily by the direct ion bombardment.

The growth behavior of multilayer films can be significantly modified by ion bombardment, or ion-assisted deposition. A current density of 75 $\mu$A/cm$^2$ at 300 V is sufficient to produce complete intermixing of Mo and Si layers. Lower voltages (~100V) increase the surface relaxation (larger v) with much less intermixing. Thus, direct ion bombardment of the growth surface can be used to control both the bilayer contraction $\delta\Lambda$ and the relaxation parameter v. A specific amount of intermixing can be obtained by applying a large energy flux for a short period during the transition between layers, that is, at the multilayer interfaces. The relaxation parameter v can be adjusted by applying a lower energy ion flux to the growth surface throughout the deposition of the multilayer.

The application of a second ion source should be compatible with the defect-free deposition technology required for reticle production. The current technology is based on ion beam sputtering, so the use of a second ion source should not be problematic. However, direct ion bombardment of the substrate is a fundamentally different process from the perspective of particle management. Particles generated within the plasma of the ion gun or knocked off grids could be directly deposited onto the substrate, and management of such particle generation would be required.

Another example of a smoothing buffer layer is MoRu/Be. Although these layers do not intermix as much as the interfaces of Mo/Si, there are other potential advantages. MoRu/Be has a very low residual stress, which permits much thicker films to be deposited without reticle bending or film delamination. Also, this buffer layer can be grown very thick while retaining its surface smoothness. The net smoothing effect is generally expected to increase with increasing buffer layer thickness, and therefore a thick MoRu/Be multilayer film is a viable buffer layer candidate. MoRu/Be multilayer films up to 1500 nm thick have been deposited with stress values of approximately 13 MPa and surface roughness values of approximately 0.15 nm rms. The relaxation parameter for MoRu/Be multilayer film growth can be adjusted in a similar manner as mentioned above for Mo/Si multilayer film growth to provide more beneficial smoothing effects.

The invention of above referenced copending application Ser. No. 09/454,715, mitigates the problem/associated with defects on the surface of a reflective reticle, and effectively reduces the perturbation resulting from defects having a height of up to at least about 60 nm. By use of the multilayer buffer layer, such as shown in FIG. 1, intermediate the reticle substrate and the reflective coating, and by controlling the deposition of the buffer layer, localized structural imperfections on the reticle substrate do not produce imperfections in a reflective multilayer coating that perturb the reflected radiation field sufficiently to print at the wafer. The present invention like that of copending application Ser. No. 09/454,715, is particularly applicable for producing near-defect free reticles required for EUVL systems, thereby enabling the EUVL technology to be commercially viable interfaces. In addition, computer simulations of Mo/Si multilayer film growth show that intermixing and surface relaxation can be optimized to mitigate substrate defects at least as large a 60 nm.

As pointed out above reticles for extreme ultraviolet lithography (EULV) are fabricated by depositing reflective multilayer coatings such as Mo/Si on superpolished substrates. These reflective reticles are a significant departure from conventional transmission reticles, and the reflective reticles must be nearly defect-free in the sense that there can not be localized structural imperfections in the coating that perturb the reflected radiation field sufficiently to print at the wafer. Recent simulations indicate that substrate particles as small as ~25 nm in diameter could perturb the reflective multilayer enough to print in commercial extreme ultraviolet lithography lithography tools. Consequently it is very important to develop methods to minimize the effect of small particle contaminants on the reflective mutlilayer film. That is accomplished by the present invention which involves sequential coating and annealing to provide a defect free surface.

Criteria that are Important for this Invention to be Practical:
1.) The roughness of the surface onto which the reflective multilayer film is deposited should be low (likely <0.3 nm); if not, the reflectivity will be significantly degraded, which will reduce the EUV lithography system throughput and increase the cost of ownership. Therefore this invention should result in a surface with a low roughness. Also, the final stress of the coatings after annealing should not be so large that it results in film delamination or for the fully processed reticle to exceed its flatness specification when placed on the electrostatic chuck for use in an EUV lithography tool.
2.) The coatings should be deposited by a low particulate deposition process and a annealing should take place in a clean environment since it will defeat the purpose of the invention if more particles are added than are smoothed over.
3.) The annealed coatings should be relatively stable over time.

Data and Analysis on Mo/Si and a-Si Coatings which Addresses the Criteria Above for this Invention:
1.) 100 nm thick sputtered amorphous Si (a-Si) coating with a surface roughness of 0.15 nm rms and a film stress of ~1250 MPa was annealed at 300° C. for approximately 3 hours. The stress after annealing was ~500 MPa and the surface roughness was 0.15 nm rms, i.e., there was an appreciable decrease in the coatings stress with no measurable increase in the surface roughness. A 280 nm thick Mo/Si multilayer coating was annealed at 200° C. for approximately 1.5 hours, resulting in a decrease in film stress from −385 MPa to −100 MPa; after annealing a surface roughness of 0.18 nm rms was measured, which is an acceptable roughness value. This demonstrates that annealing does reduce the film stress of a-Si and Mo/Si coatings without a significant increase in the surface roughness.
2.) Mo/Si multilayer films have been deposited in a low defect deposition (LDD) tool with defect densities <0.03 defects/cm$^2$ for particles >90 nm in diameter, and the defect density is being driven even further downward.
3.) Data shows that the stress in a-Si coatings decays about 5% during the first month after deposition, but is relatively stable afterwards, similar to what is observed for Mo/Si multilayers. In terms of annealing, a Mo/Si multilayer coating annealed at 200° C. was observed to negate this short-term stress decay, making the coating stress even more invariant with time.

Recent Data and Analysis on Mo/Si Multilayer Buffer-layer Films with Several Thicknesses:

Mo/Si multilayer buffer-layer films with several different thicknesses were deposited on ~48 nm diameter Au spheres on Si substrates, and the height of the resulting defects at the surface was characterized by atomic force microscopy. The results are shown in figure A; clearly the height of the defects are reduced as the buffer-layer thickness is increased. For a reticle with a 4× thick Mo/Si multilayer buffer-layer (i.e., 4×0.28 µm or 1.12 µm thick), the film stress will induce 4× more warping force on the reticle substrate, which is undesirable since reticle flatness is an issue and the likelihood of coating delamination increases with increasing film thickness unless the film stress is reduced. To reduce the film stress the sample was annealed at 200° C. for approximately 4 hours and reexamined afterwards to ensure that the defect height and shape did not change significantly due tot the annealing procedure. The same sample was subsequently coated with an additional 2× thick (i.e., 0.56 µm) Mo/Si multilayer, to make for a total of multilayer buffer-layer thickness of 6×, or 1.68 µm. This served to reduce the defect height even further, to 1.8 nm. The roughness of the surface of the 6× thick Mo/Si multilayer buffer-layer was measured to be only 0.14 nm rms, indicating that the annealing and coating procedure could be continued further.

The present invention, as illustrated in FIG. 2, is a sequential coating and annealing technique to mitigate the effects of small particle contaminants or reticles for EUV lithography. The first step is to deposit a low particulate, very smooth buffer-layer coating which could have a significant amount of film stress; ion beam sputtered Mo/Si multilayer coatings and amorphous Si (a-Si) coatings and are two examples. The first buffer-layer coating will likely be tailored via the deposition conditions to flatten out high aspect ratio bumps and asperities; in Mo/Si this may be achieved by optimizing molybdenum silicide formation at the interfaces. Due to the significant film stress and the relatively thick substrates needed for the reticles, only a modest coating thickness can be applied at first. The sample is annealed, either slowly or rapidly, with a temperature compatible with the substrates (anywhere between 100–600° C., and likely between 200–300° C.). Another buffer-layer coating is applied, and subsequently annealed, and the procedure is repeated as may times as is necessary to smooth the topology of the coating surface while retaining a top surface with a sufficiently low roughness (likely ≦0.3 nm). The second and subsequent buffer-layer coatings could be tailored via the deposition conditions to flatten out lower aspect ratio bumps and asperities, this may be achieved by enhancing surface diffusion. A reflective multilayer coating is later deposited on this healed surface to form a reticle blank for EUV lithography. The buffer layer coatings may also be composed of single layers of a-Si or a-c and buffer layer multilayers of metal or alloys, such as Mo, W, Ni, Cr, Ru, Rh, MoRu, or MoRh.

Annealing has several advantages: (i) very smooth films often have a high film stress and this can be significantly reduced by annealing, (ii) annealing can increase reactions between coatings such as a-Si, and substrate contaminants such as Mo or C-based particles, forming denser materials such as $MoSi_2$, and $SiC_2$, which should result in a shrinkage of the asperities, and (iii) annealing increases the mobility of atomic species and can enhance smoothing effects. A post-deposition annealing method has the advantage that it avoids the difficult and expensive task of controllably heating large, rotating substrates, and there is reason to believe that it may enhance the stress stability of coatings such as a-Si or Mo/Si. With post-deposition annealing a sequential annealing procedure is desirable since the highly stressed film could delaminate before it reached a sufficiently large thickness or it could result in a permanent inelastic deformation of the substrate. A sequential method also provides for greater flexibility; for example one could optimize the annealing temperatures and times for each of the steps. Low particulate, very smooth ion beam sputtered amorphous Si coatings and Mo/Si multilayer coatings are strong candidates since they will be needed for EUV lithography, and progress to date in the development of these low particulate coatings is promising. The buffer-layer produced by sequential deposition and annealing may have a thickness of up to 100 µm.

It has thus been shown that the present invention, which involves sequential coating and annealing techniques, provides a buffer-layer approach for mitigating the effect of substrate particles on reticles for EUVL. The invention produces a reticle surface which is nearly defect free in the sense that there can not be localized structure imperfections in the coatings that perturb the reflected radiation field sufficiently to print at the wafer.

While particular embodiments, materials, parameters, etc. have been illustrated and/or described to exemplify and teach the principles of the invention, such are not intended to be limiting. Modifications and changes may become apparent to those skilled in the art, and it is intended that the invention be limited only by the scope of the appended claims.

What is claimed is:

1. In a device for use in lithography having a substrate and a reflective multilayer, the improvement compromising:
   a buffer-layer consisting of a plurality of sequentially deposited and annealed layers.

2. The improvement of claim 1, wherein said plurality of sequential deposited and annealed layers are composed of material selected from the group consisting of the same material as the reflective multilayer, a material different than that of the reflective multilayer, a combination the same and different materials as in the reflective multilayer.

3. The improvement of claim 1, wherein said plurality of sequentially deposited and annealed layers are composed of layers of material selected from the group consisting of multilayer of different material, single material layers, and a combination of multilayer material and single layer material.

4. The improvement of claim 1, wherein said buffer-layer has an outer surface roughness of not greater than 0.3 nm.

5. The improvement of claim 1, wherein said buffer-layer has a thickness of up to 100 µm.

6. The improvement of claim 1, wherein said plurality of sequentially deposited and annealed layers are selected from the group consisting of MoSi multilayer films, amorphous silicon films, and combinations of MoSi multilayer and amorphous silicon films.

7. The improvement of claim 6, wherein said sequentially deposited layers are annealed at a temperature in the range of 100–600° C.

8. A reticle for extreme ultraviolet lithography, compromising:
   a substrate, and
   a buffer-layer,
   said buffer-layer consisting of a plurality of sequentially deposited and annealed layers.

9. The reticle of claim 8, wherein said plurality of sequentially deposited and annealed layers are composed of a material selected from the group of multilayered material, single layered material, and a combination of multilayered and single layered material.

10. The reticle of claim 8, wherein said multilayered material is composed of MoSi, and wherein said single layered material is composed of a-Si.

11. The reticle of claim 10, wherein said plurality of sequentially deposited and annealed layers include at least two layers selected from the group consisting of at least two bi-layers of Mo and Si, at least two layers of a-Si, and at least two layers of at least one Mo/Si bilayer and at least one layer of a-Si.

12. The reticle of claim 11, wherein each annealed layer of a-Si has a thickness of about 100 nm with a stress of about 500 MPa, and wherein each annealed layer of Mo/Si has a thickness of about 280 nm with a stress of about −100 MPa.

13. The reticle of claim 8, wherein said buffer-layer has an outer surface roughness of no greater than about 0.3 nm.

14. A method for mitigating the effect of substrate particles on reticles, such as utility in extreme ultraviolet lithography, comprising:

provinding a buffer-layer on the surface of said substrate having an outer surface roughness of not greater than about 0.3 nm, and wherein providing the buffer-layer is carried out by sequential coating and annealing of a plurality of layers of material on the substrate.

15. The method of claim 14, wherein the effect of substrate particles on reticles of about 25 nm and greater is mitigated by the sequential coating and annealing of the plurality of layers of material on the substrate.

16. The method of claim 14, wherein the sequential coating and annealing of the plurality of layers of material is carried out by depositing a first single coating or multi-layer coating, annealing the thus deposited first coating, and at least depositing a second single coating or multilayer coating, and annealing the at least second coating.

17. The method of claim 16, wherein depositing the multilayer coating is carried out by depositing at least one bilayer of material selected from the group consisting of Mo/Ru/Be and Mo/Be, Mo/Si ion-beam sputtered and deposited to a thickness of up to ~100 µm.

18. The method of claim 16, wherein the annealing is carried out after deposition and at a temperature of about 100–600° C. for a time period in the range of 0.001–48 hours.

19. The method of claim 16, wherein depositing the second layer coating is carried out by depositing a layer of material selected from the group consisting of a-Si, or a-C, and deposited to a thickness of about 100 nm.

20. The method of claim 16, wherein the annealing is carried out after depostion and at a temperature I the range of about 100° C. to about 600° C. for a time period in the range of 0.001–12 hours per step.

21. The method of claim 16, wherein depositing and annealing a single coating is carried out by depositing a 100 nm thick sputtered a-Si coating with a surface roughness of 0.15 nm RMS and a stress of −1250 MPa, and annealing the thus deposited coating at 300° C. for about 3 hours, thereby reducing the stress to −500 MPa with no change in surface roughness.

22. The method of claim 16, wherein depositing and annealing a multilayer coating is carried out by depositing a 280 nm thick MoSi multilayer coating with a stress of −385 MPa, and thereafter annealing at 200° C. for about 1.5 hours, thereby reducing the stress to −100 MPa with an after annealed surface roughness of 0.18 nm RMS.

* * * * *